(12) United States Patent  (10) Patent No.: US 8,757,874 B2
Becker et al. (45) Date of Patent: Jun. 24, 2014

(54) TEMPERATURE SENSING SYSTEM AND METHOD

(75) Inventors: Alvin G. Becker, Austin, TX (US); Daniel H. Ousley, Austin, TX (US)

(73) Assignee: National Instruments Corporation, Austin, TX (US)

( * ) Notice: Subject to any disclaimer, the term of this patent is extended or adjusted under 35 U.S.C. 154(b) by 1087 days.

(21) Appl. No.: 12/772,574

(22) Filed: May 3, 2010

(65) Prior Publication Data

US 2011/0268152 A1    Nov. 3, 2011

(51) Int. Cl.
*G01K 7/02* (2006.01)

(52) U.S. Cl.
USPC .......................... 374/179; 374/185

(58) Field of Classification Search
CPC ...................................... G01K 7/023
USPC .............. 374/179, 163, E1.018, E7.004, 170, 374/208, 185; 361/782, 760–761, 792, 795, 361/106; 29/842, 832, 837, 846, 852, 854; 702/130, 132–136; 136/200; 174/260–261
See application file for complete search history.

(56) References Cited

U.S. PATENT DOCUMENTS

| | | | |
|---|---|---|---|
| 2,690,462 A * | 9/1954 | Duckwall | 136/228 |
| 3,069,909 A * | 12/1962 | Hines | 374/208 |
| 3,211,001 A * | 10/1965 | Pettit | 374/182 |
| 4,483,632 A * | 11/1984 | Dewey et al. | 374/182 |
| 4,718,777 A * | 1/1988 | Mydynski et al. | 374/181 |
| 4,847,471 A * | 7/1989 | Wallgren et al. | 219/497 |
| 4,950,173 A * | 8/1990 | Minemura et al. | 439/82 |
| 4,964,737 A * | 10/1990 | Baker et al. | 374/179 |
| 5,281,025 A * | 1/1994 | Cali et al. | 374/141 |
| 5,623,594 A | 4/1997 | Swamy | |
| 5,765,949 A * | 6/1998 | Haddad et al. | 374/179 |
| 6,074,089 A * | 6/2000 | Hollander et al. | 374/181 |
| 6,180,867 B1 * | 1/2001 | Hedengren et al. | 136/201 |
| 6,459,707 B1 * | 10/2002 | Becker | 370/537 |
| 7,076,869 B2 | 7/2006 | Curcio et al. | |
| 7,205,486 B2 | 4/2007 | Primavera et al. | |
| 7,367,712 B2 * | 5/2008 | Becker et al. | 374/185 |
| 7,447,607 B2 * | 11/2008 | Schuh et al. | 702/130 |
| 7,480,126 B2 * | 1/2009 | Cetrulo et al. | 361/91.1 |
| 7,994,416 B2 * | 8/2011 | Schuh | 136/230 |
| 8,129,867 B2 * | 3/2012 | Harb et al. | 307/128 |
| 8,328,420 B2 * | 12/2012 | Abreu | 374/208 |
| 2005/0231928 A1 * | 10/2005 | Koughan et al. | 361/796 |
| 2009/0146295 A1 | 6/2009 | Narita et al. | |
| 2009/0168374 A1 | 7/2009 | Clayton et al. | |
| 2009/0215190 A1 * | 8/2009 | Stirn et al. | 436/147 |

* cited by examiner

*Primary Examiner* — R. A. Smith
*Assistant Examiner* — Tania Courson
(74) *Attorney, Agent, or Firm* — Meyertons Hood Kivlin Kowert & Goetzel, P.C.; Jeffrey C. Hood

(57) ABSTRACT

Provided in some embodiment is a thermocouple system that includes a printed circuit board having a terminal component connection to couple to a connector of a terminal component, a temperature sensing component connection to couple to a connector of a temperature sensing component, a signal plane thermally coupled to the terminal component connection, and a thermal plane thermally coupled to the temperature sensing component connection and electrically isolated from the terminal component connection and the signal plane. The surface area of the thermal plane overlaps a substantial portion of a surface area of the signal plane.

20 Claims, 8 Drawing Sheets

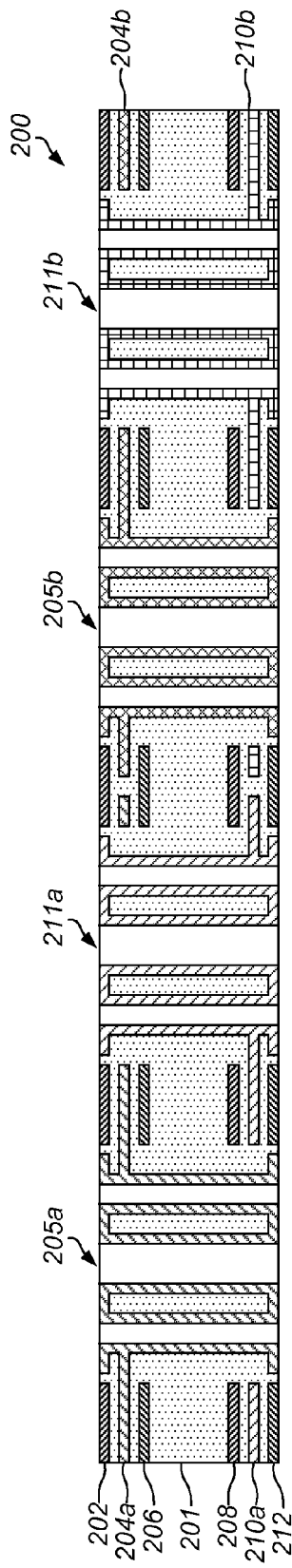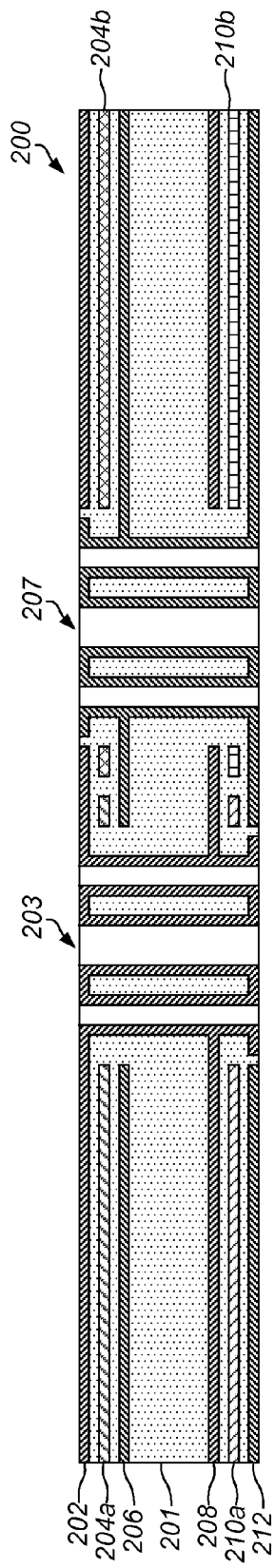
FIG. 7A
FIG. 7B

TEMPERATURE SENSING SYSTEM AND METHOD

BACKGROUND OF THE INVENTION

1. Field of the Invention

This invention relates to temperature sensing systems, and more particularly to printed circuit boards for use with thermocouples and similar devices.

2. Description of the Related Art

Thermocouples are often employed as temperature sensors to acquire temperature measurements in a number of test and measurement environments. For example, a thermocouple may be placed inside of a heating or cooling chamber to assess and determine a temperature inside the chamber. Thermocouples measure the temperature difference between two points, not absolute temperature. To measure a single temperature one of two of the junctions of the thermocouple (e.g., the cold junction—typically located near a device reading the thermocouple) is maintained at a known reference temperature, and the other of the two junctions (e.g., the hot junction) is provided at the location for sensing temperature. By determining the relative temperature difference between the hot and cold junctions and using a known or estimated reference temperature at the cold junction, a temperature at the hot junction can be determined. That is, the unknown temperature at the hot junction is determined based on a known/estimated cold junction temperature and a relative difference in temperature between the hot and cold junctions.

Determining the actual temperature at the cold junction is not always possible or practical. For example, it may be difficult or impractical to assess a cold junction temperature at each of a plurality of input terminals of a terminal block each coupled to a thermocouple. Often, applications provide a best estimate of the cold junction temperature by using a thermally sensitive device, such as a thermistor, to measure the temperature of the input connections at or near one or more terminals coupled to thermocouples. For example, where leads of a thermocouple are connected to a terminal block on a printed circuit board (PCB), a thermistor may be placed on the PCB at or near the terminal block to estimate the cold junction temperature at the terminal block. In some instances, a single thermally sensitive device may be used to estimate a single cold junction temperature for multiple terminals located near the thermally sensitive device. For example, a single thermistor may be placed adjacent a row of terminal connectors, and measurements from the single thermistor may be used to assess and estimate a cold junction temperature at all of the terminal blocks near the thermistor. Based on the temperature estimates at the thermistor, the cold junction temperature and associated voltage at the cold junction can be estimated, and the appropriate correction applied to determine a corresponding sensed temperature at the hot junction. This is known as cold junction compensation.

Unfortunately, the cold junction temperature determined using thermally sensitive devices as described above may be inaccurate by several degrees or more. For example, a temperature gradient may exist across several terminals such that the cold junction temperature at one terminal is not the same as the cold junction temp at another terminal and/or the nearby thermally sensitive device (e.g., thermistor). As a result, using the cold junction temperature acquired via the thermally sensitive device may be inaccurate for some or all of the terminals. Often, the cold junction temperature is increasingly inaccurate for terminal bocks that are located farther away from the thermally sensitive device due to temperature gradients between the thermally sensitive device and the terminal blocks. It will be appreciated that using such an inaccurate cold junction temperature may result in inaccurate cold junction compensation and, thus, in inaccurate assessments of the temperature at the hot junction.

Accordingly, it is desirable to provide a technique for acquiring accurate cold junction temperature information for thermocouples.

SUMMARY

Described herein are embodiments relating to a system and method for providing temperature measurements. For example, in one embodiment, provided is a thermocouple system that includes a printed circuit board having a terminal component connection to couple to a connector of a terminal component, a temperature sensing component connection to couple to a connector of a temperature sensing component, a signal plane thermally coupled to the terminal component connection, and a thermal plane thermally coupled to the temperature sensing component connection and electrically isolated from the terminal component connection and the signal plane. The surface area of the thermal plane overlaps a substantial portion of a surface area of the signal plane.

In another embodiment, provided is a method of fabricating a circuit board that includes providing a terminal component through-hole to couple to a connector of a terminal component, providing a temperature sensing component connection to couple to a connector of a temperature sensing component, providing a signal plane thermally coupled to the terminal component connection, and providing a thermal plane thermally coupled to the temperature sensing component connection and electrically isolated from the terminal component connection and the signal plane. A surface area of the thermal plane overlaps a substantial portion of a surface area of the signal plane.

In yet another embodiment, provided is a circuit board that includes a first terminal component through-hole to accept a first leg of first terminal component, a second terminal component through-hole to accept a second leg of a second terminal component, a first temperature sensing component through-hole to accept a first leg of a thermistor, a second temperature sensing component through-hole configured to accept a second leg of the thermistor, a first signal plane electrically and thermally coupled to the first terminal component through-hole, a second signal plane electrically and thermally coupled to the second terminal component through-hole, a first thermal plane electrically and thermally coupled to the first temperature sensing component through-hole, a second thermal plane electrically and thermally coupled to the second temperature sensing component through-hole, a thermistor having a first leg disposed in the first temperature sensing component through-hole and a second leg disposed in the second temperature sensing component through-hole, a first terminal component having a first leg disposed in the first terminal component through-hole and a second terminal component having a second leg disposed in the second terminal component through-hole. The first terminal component couples to a first lead of a thermocouple during use, and the second terminal component couples to a second lead of the thermocouple during use. Further, a surface area of the first thermal plane overlaps a substantial portion of a surface area of the first and second signal planes, and a surface area of the second thermal plane overlaps a substantial portion of a surface area of the first and second signal planes.

BRIEF DESCRIPTION OF THE DRAWINGS

A better understanding of the present invention can be obtained when the following detailed description of the preferred embodiment is considered in conjunction with the following drawings, in which:

FIG. 7A is a cross-section side view of the zone of FIG. 6 taken across lines 7A-7A in accordance with one or more embodiments of the present technique.

FIG. 7B is a cross-section side view of the zone of FIG. 6 taken across lines 7B-7B in accordance with one or more embodiments of the present technique.

Figure 1A:
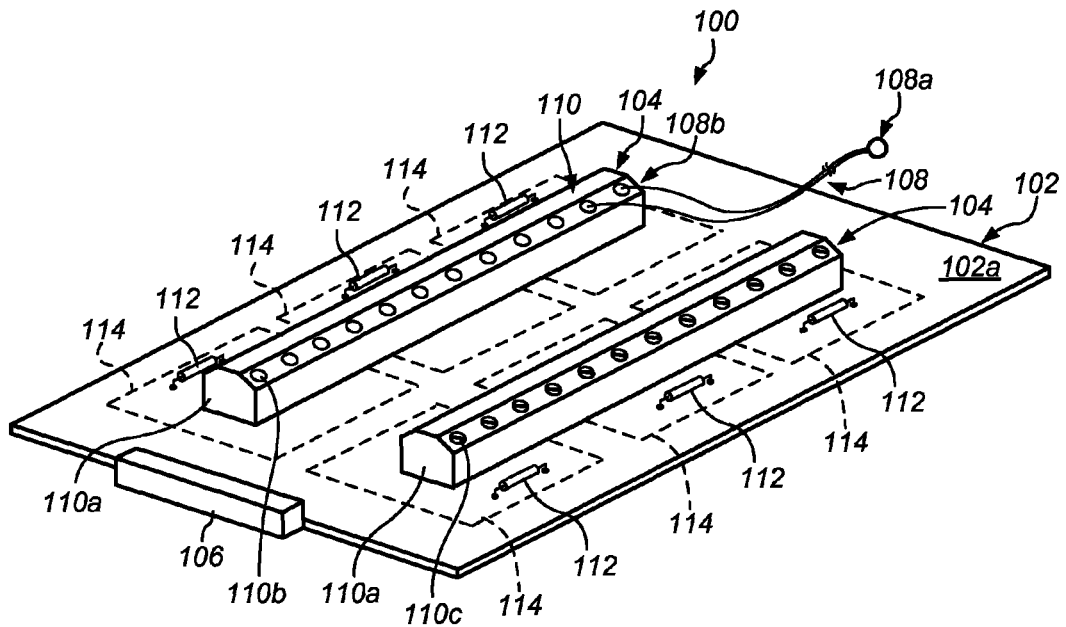
FIGS. 1A and 1B are top and bottom perspective views of an exemplary temperature measurement system in accordance with one or more embodiments of the present technique.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents, and alternatives falling within the spirit and scope of the present invention as defined by the appended claims. It is noted that the word "may" is used throughout this application in a permissive sense (e.g., having the potential to, being able to), not a mandatory sense (e.g., must).

DETAILED DESCRIPTION

In the following description, numerous specific details are set forth to provide a thorough understanding of embodiments of the present invention. However, one having ordinary skill in the art should recognize that the invention may be practiced without these specific details. In some instances, well-known circuits, structures, and techniques have not been shown in detail to avoid obscuring the present invention.

As discussed in more detail below, certain embodiments include systems and methods relating to temperature sensing systems, such as those including thermocouples. In some embodiments, a temperature sensing system includes a thermocouple cold-junction that occurs at or near a terminal block disposed on a printed circuit board (PCB). In certain embodiments, a thermal sensing device disposed near the location of the cold-junction is used to sense a temperature at or near the cold junction (e.g., the cold junction temperature). In some embodiments, a cold junction occurs at a terminal where leads (e.g., positive and negative leads) of the thermocouples are connected. In some embodiments, one or more terminals are each coupled to a respective signal plane having a surface area that is substantially overlapped by a complementary surface area of a thermal plane. In certain embodiments, at least a portion of the thermal plane may be provided at or near a terminal of the thermal sensing device such that thermal energy in the thermal plane can be provided to the thermal sensing device. In some embodiments, overlapping surface areas of the signal and thermal planes may be used to facilitate the transfer of thermal energy from the terminals to associated thermal sensing devices, thereby enabling each respective thermal sensing device to provide a more accurate representation of a temperature (e.g., a cold junction temperature) at the terminals. In certain embodiments, multiple terminals and/or temperature sensing devices may be provided within a respective zone of a PCB having overlapping signal and thermal planes.

Turning now to the figures, FIG. 1 depicts an exemplary temperature measurement system 100 in accordance with one or more embodiments of the present technique. In the illustrated embodiment, system 100 includes a printed circuit board (PCB) 102 having two sets of terminal blocks 104 and a board connector 106 disposed thereon. As depicted leads of a thermocouple 108 may be coupled to terminal blocks 104 via a pair of terminals 110. In the illustrated embodiment, system 100 also includes a plurality of temperature sensing devices 112 disposed adjacent various portions of terminal blocks 104 and their respective terminals 110. In the illustrated embodiment, each of the six temperature sensing devices 112 is disposed in one of six zones 114. In some embodiments, each temperature sensing device 112 may be disposed within a zone 114 of PCB 102 associated with one or more terminals 110 of terminal block 104. For example, in the illustrated embodiment, each temperature sensing device 112 is provided in a zone 114 associated with four terminals 110.

PCB 102 may be referred to as printed wiring board (PWB) or etched wiring board. In some embodiments, PCB 102 may include a rigid board to mechanically support and electrically connect electronic components using conductive pathways, tracks or traces etched from copper sheets laminated onto a non-conductive substrate. In some embodiments, PCB 102 may be laminated from a plurality of layers of insulating and conductive materials. For example, PCB 102 may include a multi-layer PCB having a plurality of layers bonded (e.g., laminated) to one another. In some embodiments, layers of the PCB may include a generally flat planes or sheets of material having a surface area that is substantially parallel to the top and bottom surfaces of PCB 102. A layer, for instance, may include a sheet/plane of insulating substrate, a sheet/plane of conductive material (e.g., copper), or a series of conductive pathways (e.g., traces). In some embodiments, conductive layers may be provided on external surfaces (e.g., on top 102a or bottom 102b faces) of PCB 102, or internal to PCB 102. For example, an internal conductive layer may be provided between two adjacent layers of an insulating substrate to electrically isolate the electrically conductive layer from other adjacent layers of the PCB 102 and the external environment. Conducting layers are typically made of thin copper foil. Insulating layers of a dielectric are typically laminated together with epoxy resin prepeg. Often, the PCB is coated with a solder mask that is typically green, blue or red in color. Dielectrics may be chosen to provide different insulating values depending on the requirements of the circuit. Some of these dielectrics may include polytetrafluoroethylene (Teflon), FR-4, FR-1, CEM-1 or CEM-3. Prepreg materials may include FR-2 (Phenolic cotton paper), FR-3 (Cotton paper and epoxy), FR-4 (Woven glass and epoxy), FR-5 (Woven glass and epoxy), FR-6 (Matte glass and polyester), G-10 (Woven glass and epoxy), CEM-1 (Cotton paper and epoxy), CEM-2 (Cotton paper and epoxy), CEM-3 (Woven glass and epoxy), CEM-4 (Woven glass and epoxy), CEM-5 (Woven glass and polyester). Various conductive layers of PCB 102 may be electrically coupled to one another using "vertical interconnect access", often referred to as vias. Vias include conductive holes provided with an internal electroplating liner/coating, or that are filled internally with annular rings or small rivets. Electrical vias typically include an electrically conductive material that extends perpendicular to the top and bottom faces of PCB 102 to enable the routing of electrical signals between different layers.

Figure 1B:
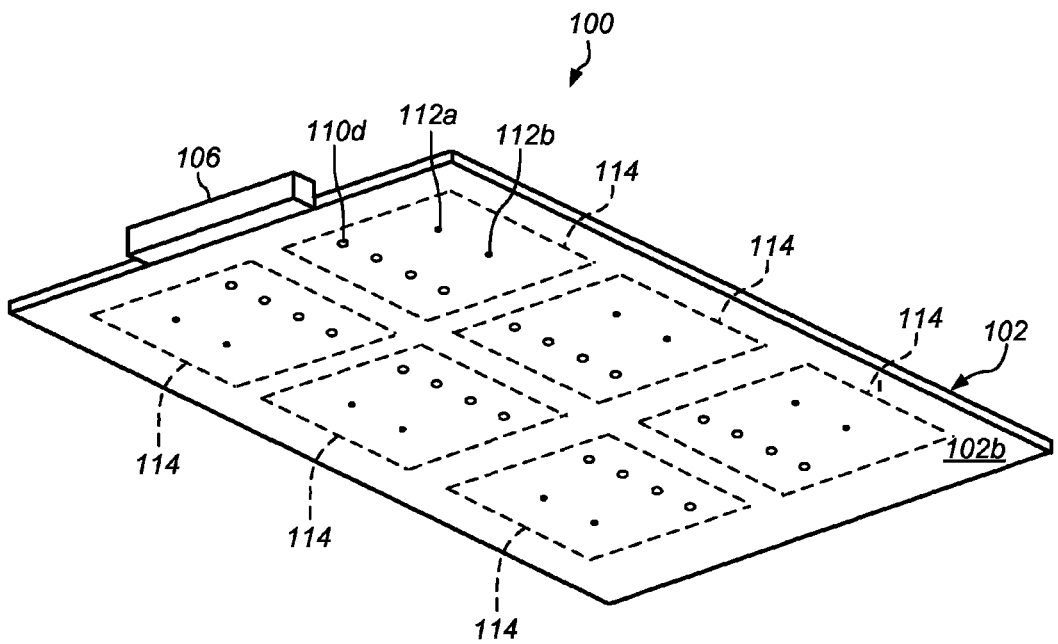

Terminal blocks 104 may provide for the connection of one or more leads of temperature sensing devices, such as thermocouple 108, to other portions of system 100. In some embodiments, terminal blocks 104 may include one or more clip or screw type terminals. In the illustrated embodiment, each of terminal blocks 104 includes twelve terminals 110. Each terminal 110 may be provided in an insulated (e.g., plastic) housing 110a, and includes an input 110b for coupling to a corresponding lead of a device (e.g., a thermocouple lead) and a fastener (e.g., screw) 110c that may be tightened to secure the lead to terminal 110. As depicted in FIG. 1B, each terminal 110 may include a through-hole component having a terminal leg 110d. Terminal leg 110d may include a conductive (e.g., aluminum) post that extends through a corresponding through-hole of PCB 102 or is otherwise coupled to a corresponding electrical connection. Terminal leg 110d may be soldered to the through-hole and/or the corresponding electrical connection of the PCB 102. For example, terminal block 104 may be placed on a top surface PCB 102 such that legs 110d extend into respective through-holes, and may be wave-soldered to couple terminal legs 110d, and thus terminal block 104, to PCB 102. Thus, terminals 100 may electrically couple a lead of thermocouple 108 to other portions of PCB 102 electrically coupled to the respective through-hole containing the respective terminal leg 110d. Other embodiments may include any number and variety of terminal blocks or connectors. For example, in some embodiments, terminals may be provided integral with board connector (e.g., edge connector 106), as described below.

Connector 106 may include a connector that provides for the transmission of data signals and/or power, to and from other devices. For example, connector 106 may include a cable connection that enable system 100 to be coupled to a computer device used to sense/process signals provided at terminals 110 and/or thermal sensing devices 112. In some embodiments, connector 106 may be coupled to terminals 110 and thermal sensing devices 112 via electrical traces of PCB 102. For example, an electrical trace within PCB 102 may electrically/thermally couple a pin within connector 106 to a component leg. Thus, a signal at the pin of connector 106 may be indicative of a signal provided at the corresponding component leg. In the illustrated embodiment, connector 106 includes an edge mount connector. In some embodiments, connector 106 may include other types of connectors, such as a surface mount connector provided on a face of PCB 102.

In some embodiments, connector 106 may include an input, similar to that described above with respect to terminal blocks 104. For example, connector 106 may include one or more terminals for coupling to a thermocouple. In some embodiments, connector 106 may be provided as a front panel connector of a modular device (e.g., a PXI card), such that thermocouple inputs may be provided via connector 106 and may be routed via backplane connector on an opposite end of PCB 102 to a backplane of a modular chassis (e.g., PXI chassis). Thus, signals fed into system 100 via connector 106 may be routed to another portion of the computer system for assessment. In an embodiment in which connector 106 includes terminals 110, connector 106 may be provided in a zone associated with a thermal sensing device provided adjacent connector 106. For example, one or more temperature sensing devices 112 may be provided on the PCB 102, adjacent a backside of connector 106.

In some embodiments, system 100 may include a stand-alone unit that is capable of acquiring and processing temperature information without the exchange of information with other devices. For example, system 100 may include an integrated processing module thereon. In such an embodiment, connector 106 may be used for the transfer or other types of data, or may not be needed at all. In some embodiments, system 100 may provided for wireless data transfer, such there is no need for an external connection to other devices for the exchange of data.

Thermocouple 108 may include a device used to sense temperature. Thermocouple may include a type K, E, J, N, B, R, S, T, C, M, or chrome-gold/iron thermocouple. In some embodiments, thermocouple 108 includes a hot junction 108a located at a first end and a cold-junction 108b located at an opposite end. Hot junction 108a may include an end of thermocouple 108 that is to be disposed at a location where it is desirable to sense temperature (e.g., a heating chamber). Thermocouple 108 may be used to assess a temperature difference between hot junction 108a and cold junction 108b. By determining the relative temperature difference between hot junction 108a and cold junction 108b and using a known or estimated reference temperature at cold junction 108b, an absolute temperature at hot junction 108a can be determined. That is, the unknown temperature at the hot junction 108a is determined based on a known/estimated cold junction temperature and a relative difference in temperature between the hot and cold junctions.

In some embodiments, hot junction 108a includes a junction of dissimilar metals that produces an electric potential relative to temperature. Cold-junction 108b may include an end of thermocouple 108 that is disposed in terminal 110 such that a voltage associated with the thermocouple may be sensed via terminal 110. For example, thermocouple 108 may include two leads (e.g., positive (+) and negative (−) leads) that are disposed into corresponding terminals of terminals 110 (e.g., positive (+) and negative (−) terminals) of block 104. The two corresponding terminals 110 may be associated with a "channel" used to measure inputs from thermocouple 108. Thus, in some embodiments, the illustrated system 100 including twenty-four terminals 100 may have twelve channels capable of sensing twelve thermocouples.

Temperature sensing device 112 may include a device capable of sensing a temperature at or near cold-junction 108b (e.g., terminal block 104). In some embodiments, temperature sensing device 112 includes a thermistor, resistance thermal detector (RTD), a semiconductor temperature sensor, or the like. Although various types of temperature sensing devices may be used, the terms "thermistor" and "temperature sensing device" may be used interchangeably throughout this specification. This is not intended to limit the scope of the embodiments, but is provided for simplicity and clarity in describing certain embodiments.

In some embodiments, temperature sensing device 112 may include a PCB mounted component. For example, in the illustrated embodiment, thermal sensing device 112 may include a through-hole mounted thermistor having two legs 112a and 112b (e.g., positive (+) and negative (−) legs) mounted to respective through-holes of PCB 102 (see FIG. 1B). Legs 112a and 112b may include conductive (e.g., copper) posts that extend through respective through-holes of PCB 102 and are soldered to the through-hole and/or a corresponding electrical connection of the PCB 102. For example, thermistor 112 may be placed on a top surface PCB 102 such that legs 112a and 112b extend into respective through-holes, and may be wave-soldered to couple legs 112a and 112b, and thus thermistor 112, to PCB 102.

In some embodiments, a temperature sensing device 112 may be provided at or near one or more cold-junctions 108b to assess a cold junction temperature of the respective cold-junctions 108b. For example, in the illustrated embodiment, each temperature sensing device 112 is provided adjacent a grouping of four terminals 110. In some embodiments, fewer or more thermal sensing devices 112 may be provided at or near cold-junctions 108b. For example, a temperature sensing device 112 may be provided adjacent each terminal 110. In some embodiments, temperature sensing devices 112 may be provided at or near any combination of groupings. For example, a temperature sensing device 112 may be provided adjacent groupings of 2, 3, 5, 6, 7, 8, 9, 10, or more terminals 112.

Some embodiments may include any number of terminals and temperature sensing devices provided within a zone based on various characteristics of the zone. For example, a zone exposed to a higher thermal gradient (e.g., higher airflow or higher electrical power dissipation) may include a fewer number of terminals and/or an increased number of temperature sensing devices, whereas a zone having a lower thermal gradient (e.g., lower airflow or lower electrical power dissipation) may have a greater number of terminals per temperature sensing device. Such an arrangement may help to improve cold junction temperature measurements and improve layout efficiency of components. For example, reducing a zone size to include a fewer number of terminals located proximate one another and associated with single temperature sensing device may help to enable accurate readings despite a high thermal gradient across the zone. Increasing a zone size to include a greater number of terminals associated with single temperature sensing device may help to improve layout efficiency by enabling a single temperature sensing device to provide temperature data for several terminals where the thermal gradient for the zone is lower and, thus, the temperature is not expected to vary significantly between the terminals during use.

Zones 114 may include various thermal features that facilitate the transfer of thermal energy (e.g., heat) of cold-junctions (e.g., terminals 110) located within the respective zone to one or more thermal sensing devices associated with zone. For example, overlapping thermal and signal planes located within a zone may improve heat transfer between the signal and thermal planes. Facilitating the transfer of thermal energy from terminals 110 to thermal sensing devices 112 may enable thermal sensing devices 112 to provide a more accurate representation of a temperature (e.g., a cold junction temperature) at terminals 110 located within their respective zone 114.

As described in more detail below, in some embodiments, each of zones 114 may include a signal plane electrically/thermally coupled to each terminal and that is substantially overlapped by a corresponding thermal plane coupled to a temperature sensing device 112 associated with the respective zone 114. In some embodiments, some or all of terminals 110 each includes a through-hole terminal leg that is provide in a corresponding terminal through-hole of PCB 102. The through-hole may include a signal plane (e.g., a sheet of electrically/thermally conductive material) coupled to and extending out/away from the through-hole in a direction substantially parallel to the upper and lower faces of PCB 102. In some embodiments, some or all of thermal sensing devices 112 each includes a through-hole leg that is to be provided in a corresponding through-hole of PCB 102. The through-hole associated with the thermal sensing device may include one or more thermal planes (e.g., a sheet of electrically/thermally conductive material) coupled to and extending out/away from the through-hole in a direction substantially parallel to the upper and lower faces of PCB 102. In some embodiments, a surface area of the signal plane is substantially overlapped by a surface area of one or more thermal planes located above and/or below the signal plane. In some embodiments, the area of the signal and thermal planes are contained within respective zones 114 containing the respective terminal 110 and the respective temperature sensing device 112.

During use, thermal energy (e.g., heat) from a terminal 110 is transferred into its terminal leg 110d and into a respective signal plane (e.g., a thick sheet of copper) via a terminal through-hole containing the terminal leg 110d. The thermal energy may be distributed across the surface area of the signal plane and may be transferred through an insulating substrate (e.g., a thin layer of FR-4 substrate of PCB 102) to an adjacent surface area of an adjacent thermal plane (e.g., a thick sheet of copper). The thermal energy may be distributed across the thermal plane such that at least some of the thermal energy is provided at or near the through-hole containing a leg of a thermal sensing device. The thermal energy may be provided to the thermal sensing device via the through hole and the leg of the thermal sensing device. In some embodiments, the signal and thermal planes may remain electrically isolated from one another, thereby enabling the planes to be used for the communication of signals to and from the respective components. For example, at least a thin layer of the insulating substrate may be provided between the signal and thermal planes to electrically isolate the planes from one another. Accordingly, in some embodiments, overlapping surface areas of electrically isolated signal and thermal planes may be used to facilitate the transfer of thermal energy from terminals 110 to thermal sensing devices 112, thereby enabling thermal sensing device 112 to provide a more accurate representation of a temperature (e.g., a cold-junction temperature) at terminal 110. In some embodiments, providing an overlap between the signal plane and the thermal plane of an increased area effectively reduces the thermal resistance between terminal 110 and thermal sensing device 112, providing for a more efficient transfer of heat between the terminal and the associated thermal sensing device.

Figure 2A:
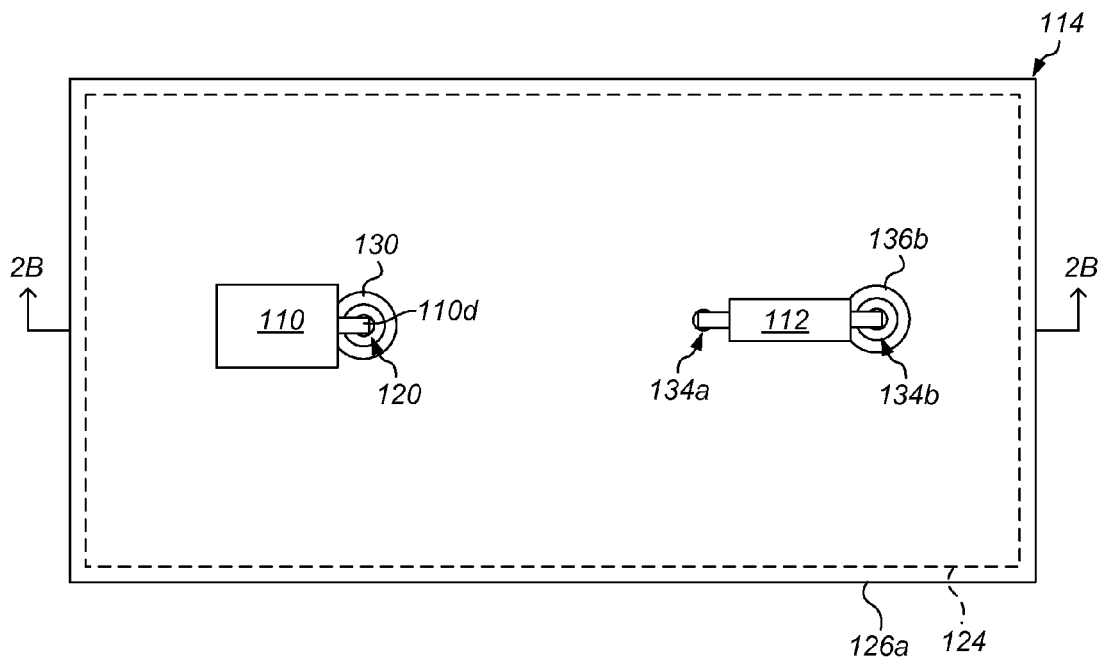
FIG. 2A is a diagram that illustrates a top-view of a zone of a temperature measurement system in accordance with one or more embodiments of the present technique.
Figure 2B:
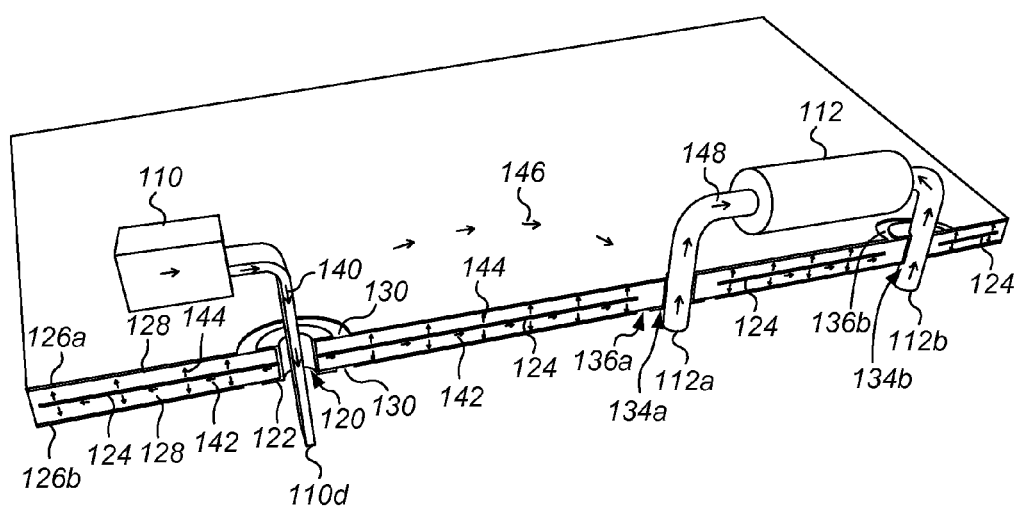
FIG. 2B is a diagram that illustrates an exemplary cross-sectioned view of the zone of FIG. 2A taken across lines 2B-2B of FIG. 2A in accordance with one or more embodiments of the present technique.

FIGS. 2A and 2B illustrate a top-view and cross-section view of a zone 114, in accordance with one or more embodiments of the present technique. In the illustrated embodiment, terminal leg 110d of terminal 110 extends into and through a terminal through-hole 120. Terminal through-hole 120 may include a hole provided through PCB 102 that acts as a receptacle for leg 110d. In some embodiments, as depicted, through-hole 120 includes a conductive lining 122. Conductive lining 122 may extend about some or all of an interior surface of through-hole 120. In some embodiments, conductive lining 122 may include a plating material, solder, rings, and/or a hollow rivet disposed along an interior surface of the through-hole 120. In some embodiments, leg 110d may be electrically coupled to conductive lining 122. For example, leg 110d may be soldered to conductive lining 122 during manufacture to electrically couple leg 110d to the conductive lining 122 of through-hole 120.

In some embodiments, a signal plane 124 is electrically/thermally coupled to through-hole 120. For example, a signal plane 124 may abut conductive lining 122 such that electrical signals and/or thermal energy may be transferred from leg 110d to signal plane 124. In some embodiments, signal plane 124 may be coupled to leg 110d in a variety of manners. For example, where no conductive lining is provided, leg 110d may be coupled directly to signal plane 124 via solder material.

In some embodiments, signal plane 124 extends outward/away from through-hole 120 and leg 110d. For example, signal plane 124 may include a sheet/layer of electrically/thermally conductive material coupled to and extending out/away from the through-hole in a direction substantially parallel to upper face 102a and lower face 102b of PCB 102. In some embodiments, signal plane 124 may extend outward in all directions. For example, signal plane 124 may include a circle, square, rectangle, or similar shape having through-hole 120 located at an interior of the circle, square, rectangle, or similar shape. A surface area of signal plane 124 may include an area of the sheet/layer that faces adjacent layers. For example, a surface area of signal plane 124 may include an area of the sheet/layer facing top and/or bottom faces 102a and 102b of PCB 102. In some embodiments, signal plane 122 may be coupled to a device for sensing an input at terminal 110. For example, in some embodiments, signal plane 124 may be coupled to a pin of connector 106 via an electrical trace, thereby enabling an input at terminal 110 to be passed to connector 106 for transmission (e.g., via a cable) to a computing device. In some embodiments, signal plane 124 may include a thick sheet of copper.

In some embodiments, one or more thermal planes 126 may be provided proximate signal plane 124. In some embodiments, thermal plane 126 may include a sheet/layer of electrically/thermally conductive material. For example, thermal planes 126a and 126b may be provided on top and bottom faces 102a and 102b of PCB 102. In some embodiments, as illustrated, at least a portion of thermal planes 126a and 126b may overlap signal plane 124. For example, in the illustrated embodiment, a surface area of signal plane 124 is provided between adjacent surface areas of thermal planes 126a and 126b. In some embodiments, signal plane 124 is isolated from adjacent thermal planes via an insulating substrate of PCB 102. For example, in the illustrated embodiment, a thin layer of substrate 128 provides an insulating gap between signal plane 124 and thermal planes 126a and 126b. In some embodiments, thermal planes 126a and 126b may be electrically isolated from conductive coating 122 of through-hole 120, leg 110d and, thus, signal plane 124, via a gap/clearance/keep-out 130 that is provided about through-hole 120.

In some embodiments, a substantial portion (e.g., greater than about 30%, 40%, 50%, 60%, 70%, 80%, 90%, 95%, 99% or even 100%) of a surface area of signal plane 124 may be overlapped by a surface area of one or more thermal planes. For example, in the illustrated embodiment, substantially all (e.g., greater than 95%) of signal plane 124 is overlapped by a portion of adjacent thermal planes 126a and 126b (see FIG. 2A). Overlapping of surface areas may occur where a surface area of one plane is located above or below (e.g., directly above or below) a corresponding surface area of another plane.

In some embodiments, at least a portion of thermal plane 126 may be electrically/thermally coupled to at least one leg 112a or 112b of thermistor 112. For example, in the illustrated embodiment, thermal plane 126a is electrically coupled to a conductive coating 132a that is disposed in a through hole 134a having leg 112a of thermistor 112 disposed therein, and thermal plane 126b is electrically coupled to a conductive coating 132b that is disposed in a through hole 134b having leg 112b of thermistor 112 disposed therein In some embodiments, thermal planes 126a and 126b may be electrically isolated from one or both legs of thermistor 112 via a gap/clearance/keep-out that is provided about through-hole 120. For example, in the illustrated embodiment, thermal plane 126a includes a gap/clearance/keep-out 136a that is provided about through-hole 134a, and thermal plane 126b includes a gap/clearance/keep-out 136b that is provided about through-hole 134b.

In some embodiments, leg 112a may include a positive terminal of thermistor 112 and leg 112b may include a negative terminal of thermistor 112. In such an embodiment, thermal plane 126a may be directly coupled to positive leg 112a and/or thermal plane 112b may be coupled to negative leg 112b. In some embodiments, thermal plane 126a may be coupled to a first pin of connector 106 associated with a positive lead of thermistor 112 via a first electrical trace and thermal plane 126b may be coupled to a second pin of connector 106 associated with a negative lead of thermistor 112 via a second electrical trace, thereby enabling a signals (e.g., voltage) across legs 112a and 112b to be provided to corresponding pins of connector 106 for transmission (e.g., via a cable) to a computing device.

During use, thermal energy (e.g., heat) from terminal 110 may dissipate from terminal leg 110d into signal plane 124 via terminal through-hole 120 (e.g., conductive lining 122) (as indicated by arrows 140). The thermal energy may be distributed across the surface area of signal plane 124 (as indicated by arrows 142) and may be transferred through insulating substrate 128 to an adjacent/overlapping surface area of thermal plane 126a and 126b (as indicated by arrows 144). The thermal energy may be distributed across the surface area of thermal planes 126a and 126b (as indicated by arrows 146) such that at least some of the thermal energy is provided at or near through holes 134a and 134b containing legs 112a and 112b of thermistor 112. The thermal energy may be provided to thermistor 112 via a conductive lining 132a and 132b of through holes 134a and 134b and legs 112a and 112b of thermistor 112 (as indicated by arrows 148). As noted above, signal plane 124 and thermal plane 126 may remain electrically isolated from one another via substrate 128 and/or appropriate gapping/clearances 130, 136, and 136b around through holes 120, 134a and 134b. Overlapping surface areas of electrically isolated signal plane 124 and thermal plane 126 may facilitate the transfer of thermal energy from terminals 110d to thermistor 112, thereby enabling thermistor 112 to provide a more accurate representation of a temperature (e.g., a cold junction temperature) at terminal 110. In some embodiments, providing an overlap between the signal plane 124 and the thermal plane 126 of an increased area effectively reduces the thermal resistance between terminal 110 and thermistor 112, providing for a more efficient transfer of heat between the terminal 110 and thermistor 112. Although the illustrated embodiment of FIGS. 2A and 2B include only a single terminal 110 associated with thermistor, zone 114 may include any number of terminals associated with one or more thermistors provided in zone 114, as described herein. Further, any number of signal planes and thermal planes may be coupled to a single leg/ through-hole. For example, two or more signal planes may be coupled to a single leg/through-hole of a terminal to facilitate the transfer of energy from the terminal. Multiple thermal planes may be coupled to a single leg/through-hole of a thermistor to facilitate the transfer of energy to the thermistor. For example, two or more thermal planes may be coupled to a single leg/through-hole of a thermistor to facilitate the transfer of energy to the thermistor.

Figure 3:
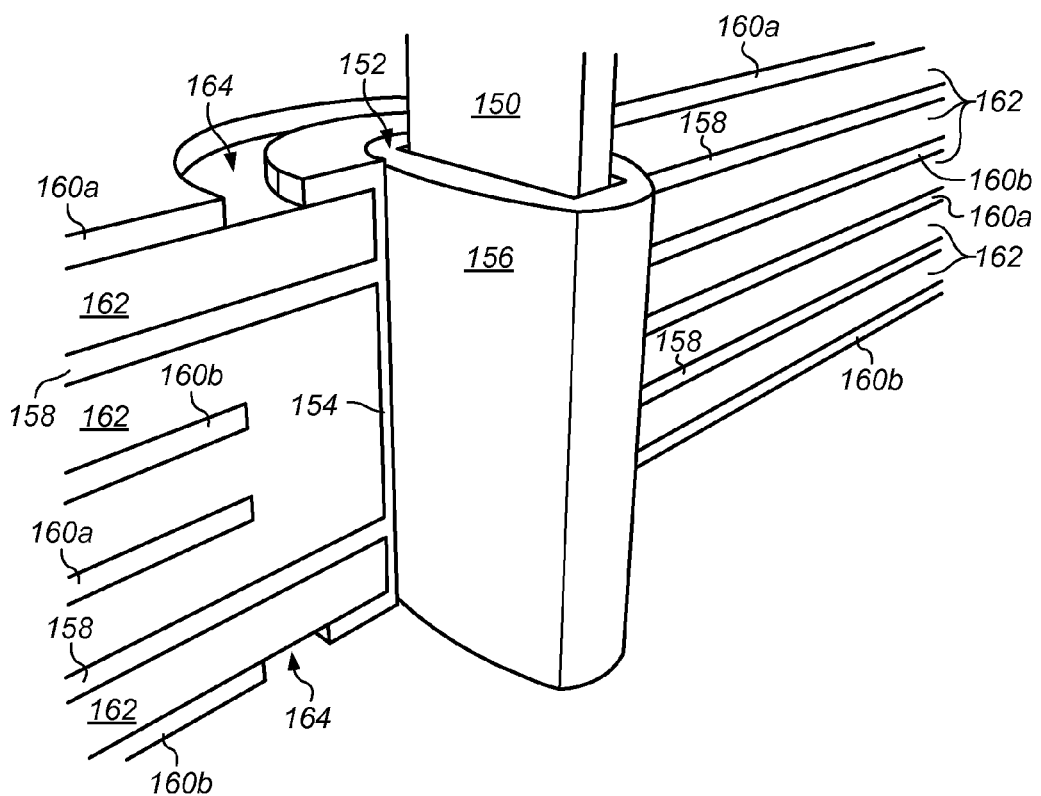
FIG. 3 is a diagram that illustrates a cross-sectioned perspective view of a component leg disposed in a through-hole in accordance with one or more embodiments of the present technique.

FIG. 3 illustrates a cross-sectioned view of a single component leg 150 coupled to a plurality of planes. In the illustrated embodiment, leg 150 is disposed in a through-hole 152. Through-hole 152 includes a conductive lining 154 coupled to component leg 150 via solder 156. As depicted, conductive lining 154 may be electrically/thermally coupled to a plurality of first planes 158 having a surface area that is substantially overlapped by adjacent second planes 160a and 160b. As depicted, in some embodiments, second planes 160a and 160b may be electrically/thermally insulted from first planes 158 via an insulating substrate 162 and gaps 164. In some embodiments, component leg 150 may be illustrative of terminal leg 110d and or thermistor legs 112a and 112b, through-hole 152 may be illustrative of through-holes 120, 134a and 134b, conductive lining 154 may be illustrative of conductive linings 122, 132a and 132b, and first planes 158 may be illustrative of multiple signal planes 124 and second planes 160a and 160b may be illustrative of multiple thermal planes 126, or vice-versa.

Figure 5:
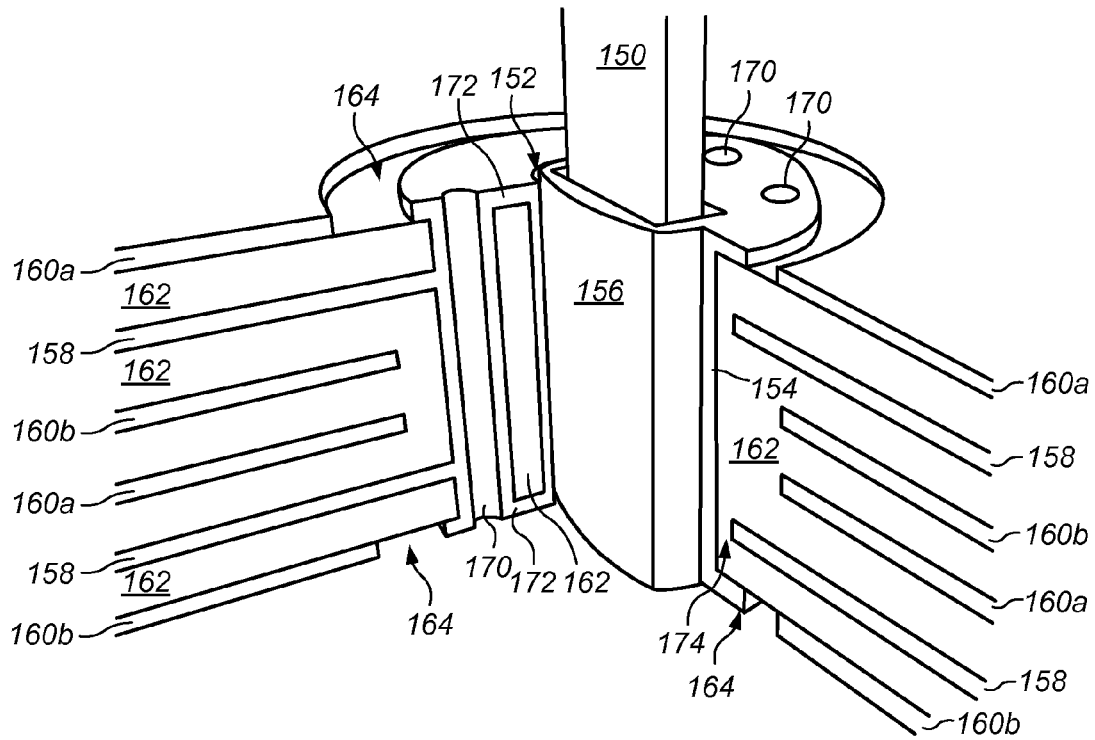
FIG. 5 is a diagram that illustrates a cross-sectioned perspective view of the through-hole and thermal vias of FIG. 4A taken across lines 5-5 of FIG. 4A in accordance with one or more embodiments of the present technique.
Figure 4A:
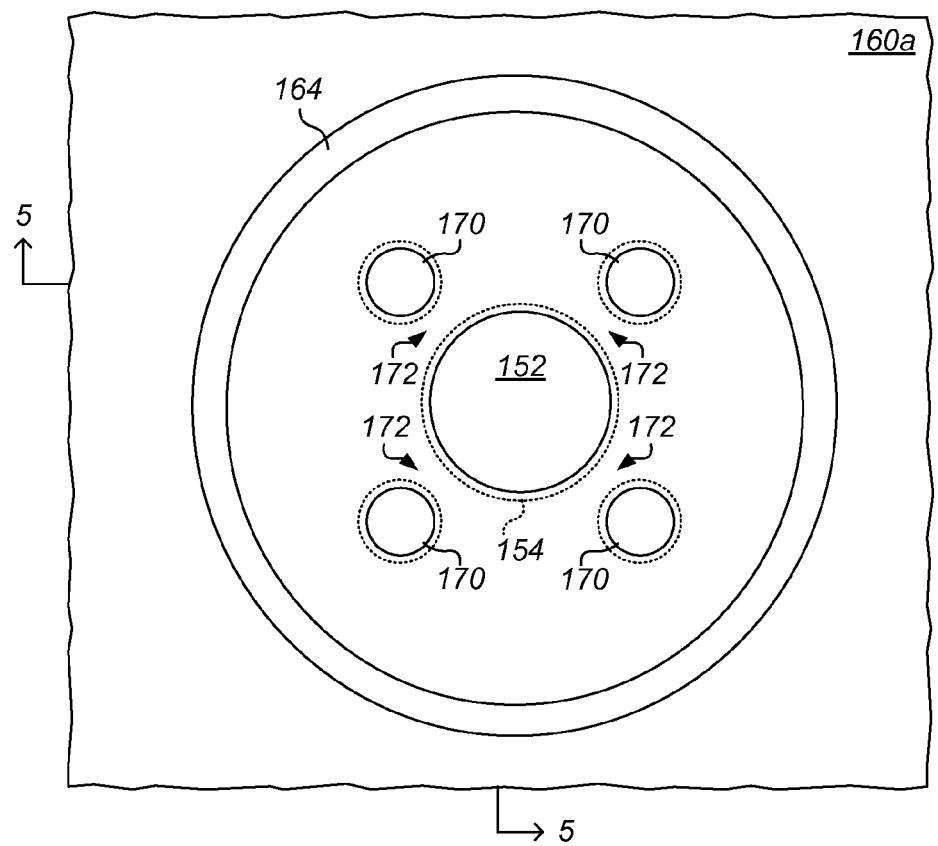
FIGS. 4A and 4B are diagrams that illustrated a top-view of layouts of through-holes and thermal vias in accordance with embodiments of the present technique.

In some embodiments, through-hole 152 may be provided in association with adjacent thermal vias. Thermal vias may help to reduce the rate of heat transfer during the soldering process, while still providing improved transfer of thermal energy from terminal 150 to associated thermal/signal planes. FIG. 4A illustrates an exemplary layout of through-hole 152 having associated thermal vias 170. More specifically, FIG. 4A illustrates a top-view of the layout, for example looking down on a top surface 102a of PCB 102. FIG. 5 illustrates a cross-sectioned isometric view taken across section 5-5 of FIG. 4A. In the illustrated embodiment, four thermal vias 170 are provided adjacent through-hole 152. As depicted, each of thermal vias 170 may include a cylinder of conductive material having a hollow opening passing there through. In some embodiments, each of thermal vias 170 may be electrically/thermally coupled to a conductive lining 154 of through-hole 152 by electrically/thermally conductive paths 172 provided at the top and bottom of thermal vias 170. In some embodiments, planes 158 are directly electrically/thermally coupled to thermal vias 170. Thus, in some embodiments, planes 158 are indirectly electrically/thermally coupled to electrically conductive liner 154 by thermal via 170 and paths 172. In some embodiments, planes 158 are not directly electrically/thermally coupled to conductive liner 154. For example, a gap 174 filled with substrate 162 electrically/thermally isolates planes 158 from direct electrical/thermal coupling to conductive liner 154.

Figure 4B:
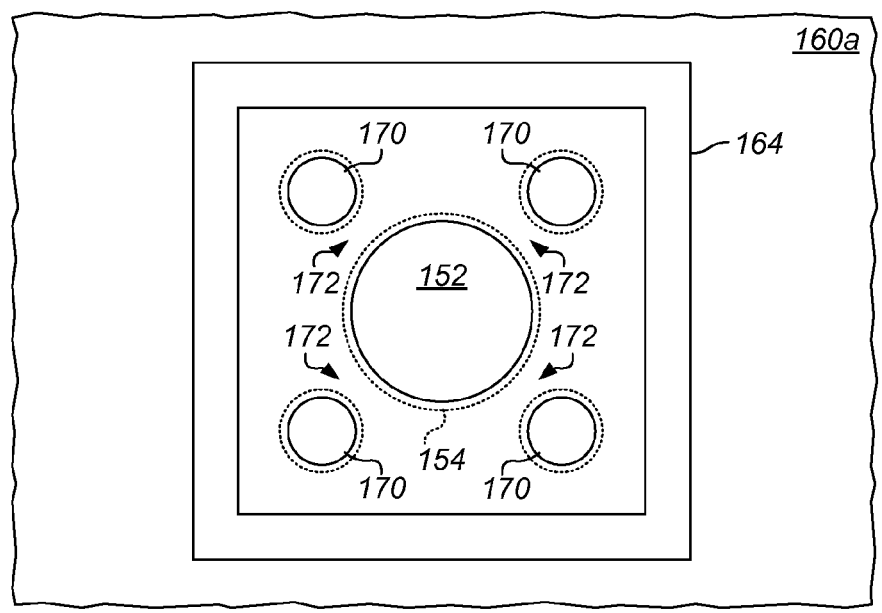

Insulating gap 164 may take a verity of shapes. For example, as depicted in FIG. 4B, conductive liner 154 of through-hole 152 may be electrically isolated from plane 160a by a square shaped gap 164. Other embodiments may include any variety of shapes, arrangements and numbers of through-holes 154 and thermal vias 170. For example, eight thermal vias 170 may be provided around through-hole 152 of FIGS. 4A and 4B.

Figure 6:
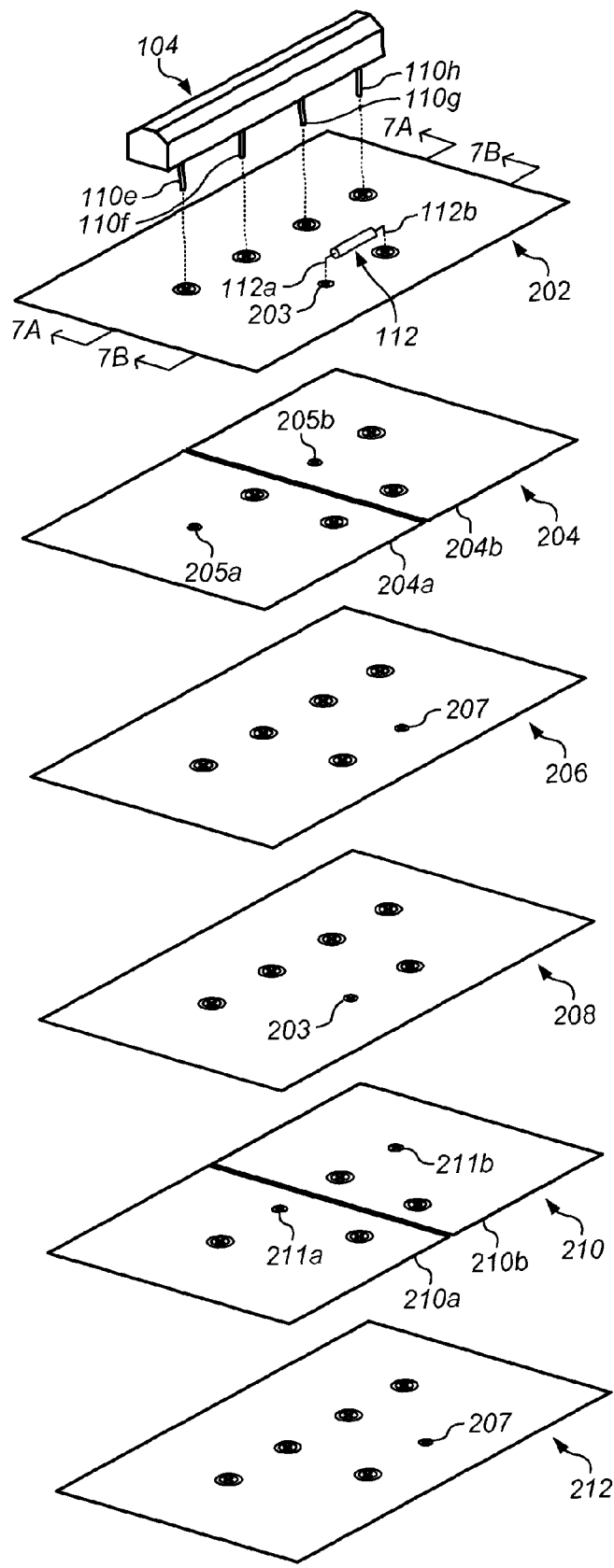
FIG. 6 is a diagram that illustrates an exploded view of a zone of a temperature measurement system in accordance with one or more embodiments of the present technique.

FIG. 6 illustrates an exploded view of a terminal block 104, a thermistor 112, and exemplary set of layers/planes of a zone 200, in accordance with one or more embodiments of the present technique. Zone 200 may be similar to some or all of zones 114 of FIGS. 1A and 1B. FIG. 7A illustrates a cross-section side view taken across lines 7A-7A of FIG. 6. FIG. 7B illustrates a cross-section side view taken across lines 7B-7B of FIG. 6. It should be noted that in the exploded view of FIG. 6, conductive planes/layers have been illustrated; however, insulating layers of substrate 201 have not been depicted in an attempt to simplify the illustration. It will be appreciated that insulating substrate may be provided between, above, below and/or around the illustrated conductive planes/layers to provide proper electrical/thermal isolation, as depicted in FIGS. 7A and 7B.

In some embodiments, terminal block 104 may include two pairs of terminals 110 for use with positive and negative terminals of a thermocouple. For example, in the illustrated embodiment, terminal block 104 includes a first pair of terminal legs 110e and 110f and a second pair of terminal legs 110g and 110h. Terminals 110e and 110g may be associated with positive signal terminals of each respective pair and terminals 110f and 110h may be associated with negative signal terminals of each respective pair. In some embodiments, thermistor 112 may include positive leg 112a and negative leg 112b.

In some embodiments, a first plane 202 includes a positive thermal plane electrically coupled to positive leg 112a of thermistor 112. In some embodiments, first plane 202 may be electrically/thermally coupled to a pin of connector 106 via an electrical trace, thereby enabling a signal at leg 112a to be communicated to connector 106 for communication (e.g., via a cable) with a computing device. As depicted, a through-hole 203 and leg 112a may be electrically/thermally coupled to plane 202, whereas the other through-holes/legs may not be electrically/thermally coupled to plane 202. In some embodiments, a substrate 201 electrically/thermally isolates first plane 202 from conductive planes located below it. In some embodiments, a top surface of first plane 202 may be covered with a layer of substrate 201 or similar insulating medium to prevent external exposure of plane 202 to the atmosphere. Through-hole 203 may be similar to through-hole 152 and associated components depicted and described with respect to FIG. 3 or 5.

In some embodiments, a second plane 204, located below first plane 202, includes a first positive signal plane 204a electrically coupled to positive terminal leg 110e and a second positive signal plane 204b electrically coupled to positive terminal leg 110g. In some embodiments, signal planes 204a and 204b may be electrically/thermally isolated from one another (e.g., via a gap between them). In some embodiments, first and second positive signal planes 204a and 204b may be electrically/thermally coupled to different pins of connector 106 via an electrical trace, thereby enabling a signal at legs 110e and 110g to be communicated to pins of connector 106 for communication (e.g., via a cable) with a computing device. As depicted, through-holes 205a and 205b and legs 110e and 110g may be electrically/thermally coupled to planes 204a and 204b, respectively, whereas the other through-holes/legs may be not be electrically/thermally coupled to plane 202. Substrate 201 may electrically/thermally isolate second planes 204a and 204b from one another and from conductive planes located above and below them. Through-holes 205a and 205b may be similar to through-hole 152 and associated components depicted and described with respect to FIG. 3 or 5.

In some embodiments, a third plane 206, located below second plane 204, includes a negative thermal plane electrically coupled to negative leg 112b of thermistor 112. In some embodiments, third plane 206 may be electrically/thermally coupled to a pin of connector 106 via an electrical trace, thereby enabling a signal at leg 112b to be communicated to connector 106 for communication (e.g., via a cable) with a computing device. As depicted, a through-hole 207 and leg 112b may be electrically/thermally coupled to third plane 206, whereas the other through-holes/legs may be not be electrically/thermally coupled to third plane 206. A layer of substrate 201 may electrically/thermally isolates third plane 206 from conductive planes located above and below it. Through-hole 207 may be similar to through-hole 152 and associated components depicted and described with respect to FIG. 3 or 5.

In some embodiments, a fourth plane 208, located below third plane 206, includes a positive thermal plane electrically coupled to positive leg 112a of thermistor 112. In some embodiments, fourth plane 208 may be electrically/thermally coupled to a pin of connector 106 via an electrical trace, thereby enabling a signal at leg 112a to be communicated to connector 106 for communication (e.g., via a cable) with a computing device. As depicted, through-hole 203 and leg 112a may be electrically/thermally coupled to fourth plane 208, whereas the other through-holes/legs may be not be electrically/thermally coupled to fourth plane 208. A layer of substrate 201 may electrically/thermally isolates fourth plane 206 from conductive planes located above and below it.

In some embodiments, a fifth plane 210, located below fourth plane 208, includes a first negative signal plane 210a electrically coupled to negative terminal leg 110f and a second negative signal plane 210b electrically coupled to negative terminal leg 110h. In some embodiments, signal planes 210a and 210b may be electrically/thermally isolated from one another. In some embodiments, first and second negative signal planes 210a and 210b may be electrically/thermally coupled to different pins of connector 106 via an electrical trace, thereby enabling a signal at legs 110f and 110h to be communicated to connector 106 for communication (e.g., via a cable) with a computing device. As depicted, through-holes 211a and 211b and legs 110f and 110h may be electrically/thermally coupled to plane 210, whereas the other through-holes/legs may be not be electrically/thermally coupled to plane 210. Substrate 201 may electrically/thermally isolate fifth planes 210a and 210b from one another and from conductive planes located above and below them. Through-holes 211a and 211b may be similar to through-hole 152 and associated components depicted and described with respect to FIG. 3 or 5.

In some embodiments, a sixth plane 212 includes a negative thermal plane electrically coupled to negative leg 112b of thermistor 112. In some embodiments, sixth plane 212 may be electrically/thermally coupled to a pin of connector 106 via an electrical trace, thereby enabling a signal at leg 112b to be communicated to connector 106 for communication (e.g., via a cable) with a computing device. As depicted, through-hole 207 and leg 112b may be electrically/thermally coupled to sixth plane 212, whereas the other through-holes may be not be electrically/thermally coupled to sixth plane 212. A layer of substrate 201 may electrically/thermally isolate sixth plane 212 from conductive planes located above it. In some embodiments, a bottom surface of sixth plane 212 may be covered with a layer of substrate 201 to prevent external exposure to the plane to the atmosphere.

In some embodiments, some or all of the through-holes of zone 200 may include thermal vias. For example, in the illustrated embodiment, all of the through-holes include four thermal vias surrounding them. In instances where the conductive layer is electrically/thermally isolated from a leg, a gap may be provided between the respective through-hole/thermal vias and the conductive layer. In some embodiments, the signal and thermal layers may include a thick (e.g. about 0.0042 inch thick) sheet of copper or similar electrically/thermally conductive material. In some embodiments, substrate provided between layer may include a thin (e.g., about 0.005 inch thick) layer of substrate. In some embodiments, gaps provided between various thermal and signal layers may be about 0.010 inches in size. In some embodiments, some or all of zones 114 of system 100 may implement techniques that are the same or similar to those described with respect to zone 200.

Although many of the above embodiments have been described with respect to through-hole connections and complementary connectors (e.g., legs) of through-hole components, similar techniques may be applied to other connections and components, such as surface mount connections and components. For example, in the above embodiments, a surface mount connection (e.g., surface mounted solder pad) may be coupled to a corresponding signal plane or thermal plane as described herein. Thus, thermal energy may be transferred between components and respective signal and thermal planes via a surface mount connection. In some embodiments, a surface mount connection may be coupled to planes of the PCB by way of a via extending between layers of the PCB, in place of or in combination with a through-hole. Accordingly, embodiments may include the use of surface mount connections and connectors in place of, or in combination with, through-hole connections and connectors as described herein.

Figure 8:
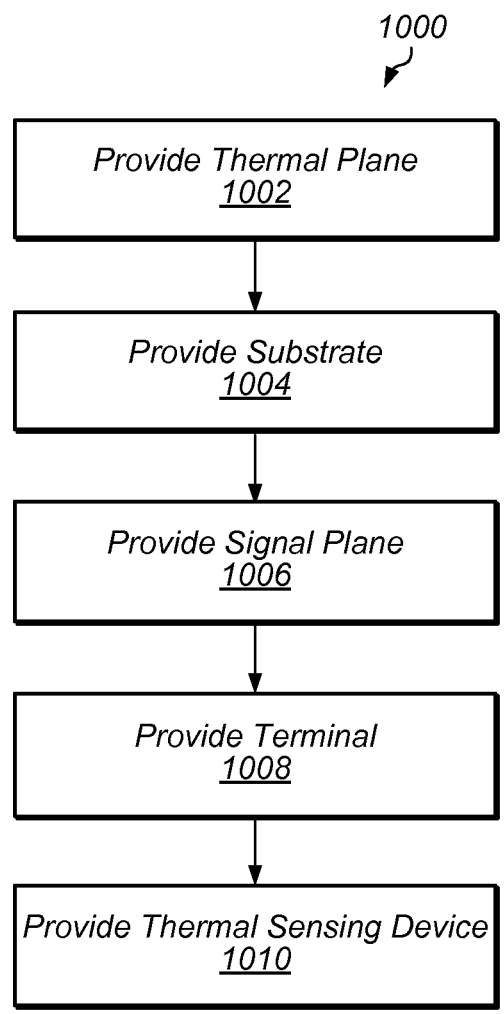
FIG. 8 is a flowchart that illustrates a method of fabricating a temperature measurement system in accordance with one or more embodiments of the present technique.

FIG. 8 is a flowchart that illustrates a method 1000 of fabricating a circuit board of temperature sensing system in accordance with one or more embodiments of the present technique. Method 1000 may include providing a thermal plane, as depicted at block 1002. Providing a thermal plane may include providing at least a portion of a thermal plane as in any of the embodiments described herein. For example, providing a thermal plane may include providing any one of planes 126a, 126b, 160a, 160b, 202, 206, 208, or 212 described herein. Method 1000 may include providing a substrate, as depicted at block 1004. For example, in some embodiments, a PCB substrate or similar electrical insulating material may be provided adjacent to the provided thermal plane to facilitate electrically isolating the thermal plane from other planes, such as an adjacent signal plane or conductive portions of adjacent through-holes. Providing a substrate may include providing a substrate as described in any of the above embodiments. For example, providing a substrate may include providing any one of substrates 128, 162, and 201 described herein. Method 1000 may include providing a signal plane, as depicted at block 1006. Providing a signal plane may include providing at least a portion of an electrically/thermally conductive plane as in any of the embodiments described herein. For example, providing a signal plane may include providing at least a portion of any one of signal planes 124, 158, 204, or 210, described herein. In some embodiments, a substantial portion of a surface area of the signal plane may be overlapped by a portion of the surface area of the thermal plane as described herein. In some embodiments, providing planes may include providing additional features, such as connections for components. In some embodiments, the connections for components may include through-holes that may or may not include thermal vias. In some embodiments, method 1000 may include providing one or more terminals, as depicted at block 1008. For example, providing a terminal may include inserting and fastening (e.g., soldering) one or more terminal legs (e.g., 110d-110h and/or 150) to a corresponding through-hole of a PCB. In some embodiments, method 1000 may include providing one or more temperature sensing devices, as depicted at block 1010. For example, providing a temperature sensing device may include inserting and fastening (e.g., soldering) one or more thermistor legs (e.g., 112*a* and/or 112*b*) to a corresponding through-hole of a PCB. Such a temperature sensing device may be provided in a corresponding zone, as described herein. It will be appreciated that method 1000 is an exemplary embodiment, and, thus, modifications to method 1000 may fall within the scope of the techniques described herein. In some embodiments, steps may be removed, additional steps may be inserted, steps may be rearranged, steps may be repeated, or the like. For example, in some embodiments, steps of providing thermal plane 1002 and providing signal plane 1006 may be repeated several times where a PCB includes multiple thermal and/or signal planes, such as described with regard to FIGS. 3-7B.

In some embodiments, system 100 may be implemented to acquire signals for use in assessing temperature measurements. During use, signals from system 100 may be provided to a computing device to assess temperature measurements at the attached thermocouples, for instance. In some embodiments, For example, connector 106 may be coupled to computing device (e.g., a PCI card in a personal computer or a PXI chassis back plane) to facilitate communication with such a computing device. In some embodiments, system 100 may be a component of a larger test and measurement system.

Figure 9:
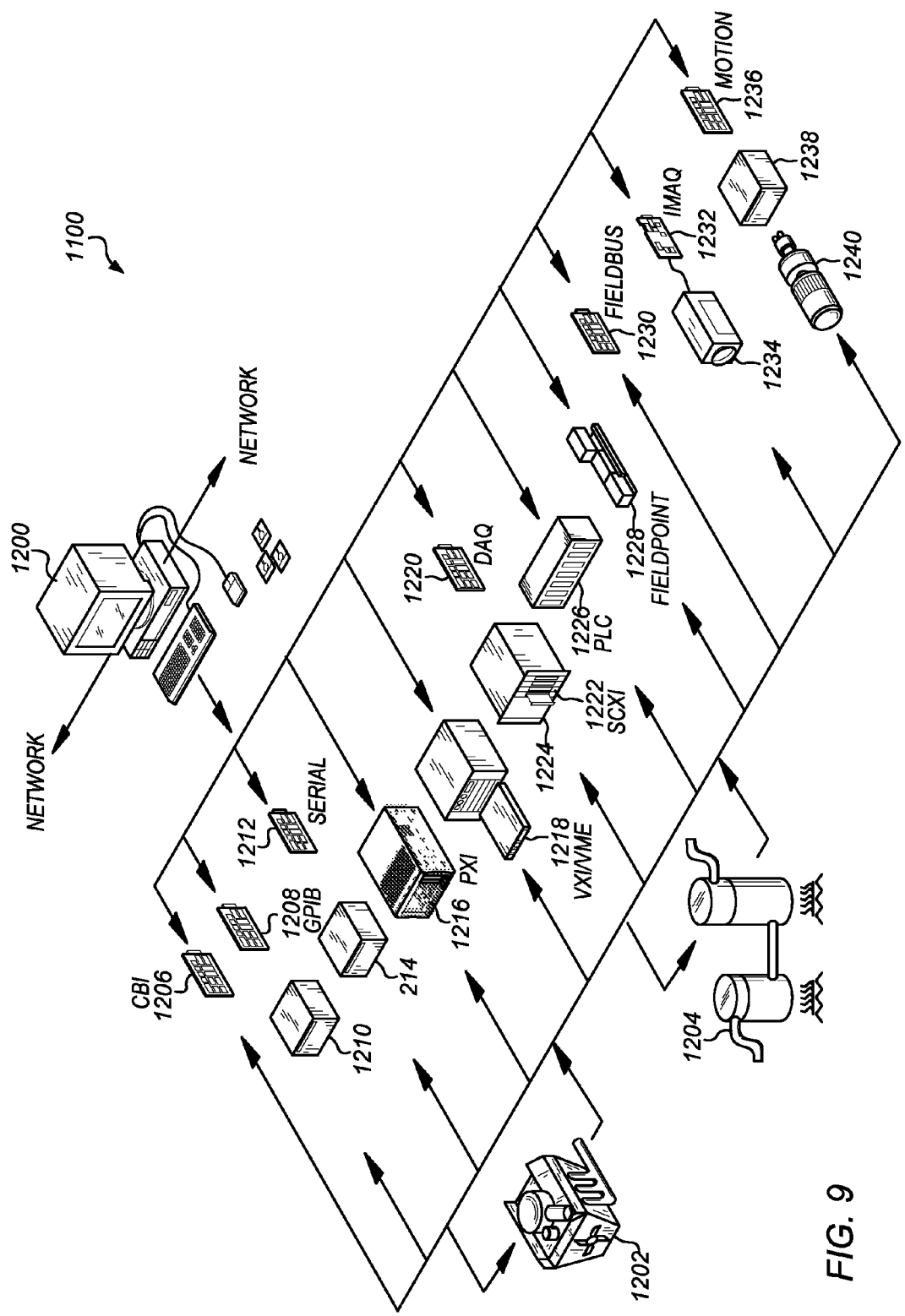
FIG. 9 is a diagram that illustrates an exemplary measurement/control system that may implement a temperature measurement system in accordance with one or more embodiments of the present technique.

FIG. 9 is a diagram that illustrates an exemplary measurement/control system ("computer system") 1100 that may implement a temperature measurement system 100 in accordance with one or more embodiments of the present technique. Computer system 1100 may include various combinations of hardware and software that include devices that can be used to implement various computer based processes. In the illustrated embodiment, computer system 1100 includes a host computer system 1200. Host computer system 1200 may be operable to execute computer programs/routines that provide various computer related functions. Host computer system 1200 may include various components such as central processing unit (CPU) and a memory medium. The memory medium may include a tangible non-transitory computer readable storage medium, such as random access memory (RAM), flash memory, hard-drives, and/or CD-ROMs, or the like. The memory medium may have program instructions stored thereon that are executable (e.g. by CPU) to implement one or more computer implemented methods. In the illustrated embodiment, host computer system 1200 includes a display device (e.g., a monitor), an alphanumeric input device (e.g., a keyboard), and a directional input device (e.g., a mouse). In some embodiments, host computer system 1200 may include modular and/or plug-in boards/cards (e.g., with either commercially available or proprietary hardware) that may be added via a number of expansion slots internal or external to the computer body. For example, host computer system 1200 may include PCI/PCI Express slots and PCI/PCI Express cards disposed therein. As described in more detail below, host computer system 1200 may be connected to one or more devices, such as an expansion chassis for connecting to a various number and combination of devices. In certain embodiments, host computer system 1200 and/or other portions of computer system 1100 may be connected to one or more other devices via a network, such as an internal network (e.g., a local area network (LAN)) and/or an external network (e.g., the internet). In certain embodiments, host computer system 1200 may be used for various input/output (I/O) functions and processing tasks. For example, host computer system 200 may be used for data acquisition (DAQ) (e.g., when a DAQ digitizing board is installed in computer 200 or a device coupled thereto, such as a chassis, and associated software is run). In some embodiments, DAQ processes may be implemented to acquire data (e.g., thermocouple and thermistor measurements) from temperature measurement system 100.

Host computer system 1200 may be configured to connect/communicate with other instruments/devices of computer system 1100. In some embodiments, host computer system 1200 may operate with the one or more devices of computer system 1100 to generate and provide data, to acquire data, to analyze data. For example, computer system may communicatively couple to and control one or more devices 1202, processes 1204, or the like. Host computer system 1200 may operate with the one or more devices in communication with device 1202 or process 1204 to perform an automation function, such as MMI (Man Machine Interface), SCADA (Supervisory Control and Data Acquisition), portable or distributed data acquisition, process control, advanced analysis, or other data acquisition and control functions. For example, computer system 1100 may be used to implement data acquisition and control applications, test and measurement applications, image acquisition and processing application, machine vision processing applications, process control applications, man-machine interface applications, simulation applications, hardware-in-the-loop validation applications, motion control applications, computer based instruments (CBI) applications, signal conditioning (SCXI) applications, or the like. One or more of the instruments/devices of computer system 1100 may include a programmable hardware element, using an FPGA or a processor and memory, and/or one or more portions of user code.

Computer system 1100 may include a variety of devices. For example, computer system 1100 may include modular instrumentation devices, such test and measurement devices manufactured by National Instruments Corporation, headquartered in Austin, Tex. In some embodiments, computer system 1100 may include computer based instrumentation (CBI) 1206, such as a digital multi-meter (DMM), an oscilloscope (SCOPE), a radio-frequency (RF) device (e.g., up-converter or down-converter), an arbitrary waveform generator (ARB), or the like. Computer system 1100 may include general purpose interface bus (GPIB) devices 1208, such as a modular GPIB card used to communicate with a GPIB device 1210 (e.g., an oscilloscope) via a GPIB communication protocol. Computer system 1100 may include serial devices 1212, such as a modular serial card used to communicate with a serial device 1214 (e.g., an oscilloscope) via a serial communication protocol. Computer system 100 may include (PXI) devices 1216, such as a PXI chassis 1300 having PXI form factor modular devices (e.g., modules) 1302 installed therein. Computer system 1100 may include VXI/VME devices 1218, such as a VXI/VME chassis having VXI/VME form factor modular devices (e.g., VXI/VME controllers/modules) installed therein. Computer system 1100 may include data acquisition (DAQ) device 1220, such as modular instrumentation including data input/output (I/O) interfaces for receiving, transmitting, conditioning, and/or processing signals (e.g., digital and analog signals). Computer system 1100 may include signal conditioning (SCXI) devices 1222 that can be used to condition and/or route signals, such as I/O signals as those transmitted/received at DAQ device 1220. SCXI devices 1222 may include a chassis 224 having devices 1222 installed therein (e.g., a relay/switch module). Computer system 1100 may include a programmable logic controller (PLC) 226, such as a PLC used for the automation of electromechanical process. Computer system 1100 may include distributed I/O modules, such as a fieldpoint module 1228. Computer system 1100 may include a distributed control modules, such as a fieldbus module 1230. Computer system 1100 may include image acquisition (IMAQ) systems, such as a modular IMAQ module 1232 and an associated IMAQ device (e.g., camera) 1234. Computer system 1100 may include motion control systems, such as a modular motion controller device 1236, a motor drive 1238, and a motor 1240. Computer system 1100 may include any variety of other devices. Although some of the devices are illustrated in association with a chassis (e.g., modules) and some or illustrated independent from a chassis (e.g., card or standalone devices), embodiments may include all or some of the described device being provided in a module form factor to be housed in a chassis and/or a card form factor be installed in computer 1200. For example, PXI device 1216 may include a PXI chassis housing any combination of modular CBI devices, GPIB devices, serial devices, SCXI devices, DAQ devices, IMAQ devices, motion devices, or the like. In some embodiments, the devices may also be provided in a PCI form factor and installed in PCI slots of computer 1200.

Although the embodiments above have been described in considerable detail, numerous variations and modifications will become apparent to those skilled in the art once the above disclosure is fully appreciated. It is intended that the following claims be interpreted to embrace all such variations and modifications. Furthermore, note that the word "may" is used throughout this application in a permissive sense (e.g., having the potential to, being able to), not a mandatory sense (e.g., must). The term "include", and derivations thereof, mean "including, but not limited to". As used in this specification, the singular forms "a", "an" and "the" include plural referents unless the content clearly indicates otherwise. Thus, for example, reference to "a device" includes a combination of two or more devices. The term "coupled" means "directly or indirectly connected".

We claim:

1. A system, comprising:
  a printed circuit board, wherein prior to assembly, the printed circuit board comprises:
    a terminal component connection configured to couple to a connector of a terminal component;
    a temperature sensing component connection configured to couple to a connector of a temperature sensing component;
    a signal plane thermally coupled to the terminal component connection; and
    a thermal plane thermally coupled to the temperature sensing component connection and electrically isolated from the terminal component connection and the signal plane,
    wherein a surface area of the thermal plane overlaps a substantial portion of a surface area of the signal plane.

2. The system of claim 1, wherein the thermal plane is electrically coupled to the temperature sensing component connection.

3. The system of claim 1, wherein the surface area of the thermal plane that overlaps a substantial portion of the surface area of the signal plane is located directly above or below the surface area of the signal plane.

4. The system of claim 1, further comprising:
  an other temperature sensing component connection configured to accept an other connector of a temperature sensing component; and
  an other thermal plane thermally coupled to the other temperature sensing component connection and electrically isolated from the terminal component connection and the signal plane,
  wherein a surface area of the other thermal plane overlaps a substantial portion of the surface area of the signal plane.

5. The system of claim 4, wherein the signal plane is disposed between the thermal plane and the other thermal plane.

6. The system of claim 1, further comprising:
  an other terminal component connection configured to accept a connector of an other terminal component; and
  an other signal plane electrically coupled to the other terminal component connection,
  wherein a surface area of the thermal plane overlaps a substantial portion of the surface area of the other signal plane.

7. The system of claim 6, wherein the terminal component connection and the other terminal component connection are located proximate the temperature sensing component connection such that a temperature measurement associated with a temperature sensing component coupled to the temperature sensing component connection is associated with a cold-junction temperature of a terminal coupled to the terminal component connection and an other terminal disposed in the other terminal component connection, during use.

8. The system of claim 1, wherein the temperature sensing component comprises a thermistor, and further comprising a thermistor connector coupled to the temperature sensing component connection.

9. The system of claim 1, wherein at least one of the terminal component connections and the temperature sensing component connections comprises one or more thermal vias.

10. The system of claim 1, wherein at least one of the connections comprises a through-hole and wherein at least one of the connectors comprises a complementary component leg configured to be disposed in the through-hole.

11. A method of fabricating a circuit board, comprising:
  providing a terminal component through-hole configured to couple to a connector of a terminal component;
  providing a temperature sensing component connection configured to couple to a connector of a temperature sensing component;
  providing a signal plane thermally coupled to the terminal component connection; and
  providing a thermal plane thermally coupled to the temperature sensing component connection and electrically isolated from the terminal component connection and the signal plane,
  wherein a surface area of the thermal plane overlaps a substantial portion of a surface area of the signal plane.

12. The method of claim 11, wherein at least one of the connections comprises a through-hole and wherein at least one of the connectors comprises a complementary component leg configured to be disposed in the through-hole.

13. The method of claim 11, wherein the thermal plane is electrically coupled to the temperature sensing component connection.

14. The method of claim 11, wherein the surface area of the thermal plane that overlaps a substantial portion of the surface area of the signal plane is located directly above or below the surface area of the signal plane.

15. The method of claim 11, further comprising:
  providing an other temperature sensing component connection configured to accept an other connector of a temperature sensing component; and
  providing an other thermal plane thermally coupled to the other temperature sensing component connection and electrically isolated from the terminal component connection and the signal plane, wherein a surface area of the other thermal plane overlaps a substantial portion of the surface area of the signal plane.

16. The method of claim 15, wherein the signal plane is disposed between the thermal plane and the other thermal plane.

17. The method of claim 11, further comprising:
providing an other terminal component connection configured to couple to a connector of an other connection terminal component; and
providing an other signal plane electrically coupled to the other terminal component connection,
wherein a surface area of the other thermal plane overlaps a substantial portion of the surface area of the other signal plane.

18. The method of claim 17, wherein the terminal component connection and the other terminal component connection are located proximate the temperature sensing component connection such that a temperature measurement associated with a temperature sensing component disposed in the temperature sensing component connection is associated with a cold-junction temperature of a terminal disposed in the terminal component connection and an other terminal disposed in the other terminal component connection, during use.

19. The method of claim 11, further comprising disposing a thermistor connector in the temperature sensing component connection, wherein the temperature sensing component comprises a thermistor.

20. A system, comprising:
a printed circuit board, wherein prior to assembly, the printed circuit board comprises:
a first terminal component through-hole configured to accept a first leg of first terminal component;
a second terminal component through-hole configured to accept a second leg of a second terminal component;
a first temperature sensing component through-hole configured to accept a first leg of a thermistor;
a second temperature sensing component through-hole configured to accept a second leg of the thermistor;
a first signal plane electrically and thermally coupled to the first terminal component through-hole;
a second signal plane electrically and thermally coupled to the second terminal component through-hole;
a first thermal plane electrically and thermally coupled to the first temperature sensing component through-hole, wherein a surface area of the first thermal plane overlaps a substantial portion of a surface area of the first and second signal planes; and
a second thermal plane electrically and thermally coupled to the second temperature sensing component through-hole, wherein a surface area of the second thermal plane overlaps a substantial portion of a surface area of the first and second signal planes;
a thermistor mounted on the printed circuit board, wherein the thermistor comprises a first leg disposed in the first temperature sensing component through-hole and a second leg disposed in the second temperature sensing component through-hole;
a first terminal component mounted on the printed circuit board, wherein the first terminal component comprises a first leg disposed in the first terminal component through-hole, wherein the first terminal component is configured to couple to a first lead of a thermocouple; and
a second terminal component mounted on the printed circuit board, wherein the second terminal component comprises a second leg disposed in the second terminal component through-hole, wherein the second terminal component is configured to couple to a second lead of the thermocouple.

* * * * *